US009634681B1

(12) United States Patent
Kunnen et al.

(10) Patent No.: US 9,634,681 B1
(45) Date of Patent: Apr. 25, 2017

(54) ANALOG-TO-DIGITAL CONVERSION WITH LINEARITY CALIBRATION

(71) Applicant: FREESCALE SEMICONDUCTOR INC., Austin, TX (US)

(72) Inventors: George R. Kunnen, Chandler, AZ (US); Mark A. Lancaster, Scottsdale, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/221,317

(22) Filed: Jul. 27, 2016

(51) Int. Cl.
  H03M 1/10 (2006.01)
  H03M 1/12 (2006.01)
(52) U.S. Cl.
  CPC ........... *H03M 1/1009* (2013.01); *H03M 1/12* (2013.01)
(58) Field of Classification Search
  CPC ................................. H03M 1/12; H03M 1/00
  USPC .................. 341/120, 118, 119, 155, 156, 167
  See application file for complete search history.

(56) References Cited

U.S. PATENT DOCUMENTS

| 5,764,541 A * | 6/1998 | Hermann ................. G01G 5/06 341/167 |
|---|---|---|
| 7,379,831 B1 | 5/2008 | Tsyrganovich |
| 8,542,138 B2 | 9/2013 | Galton et al. |
| 9,219,493 B1 | 12/2015 | Kunnen et al. |
| 2013/0106631 A1 | 5/2013 | Petigny et al. |

FOREIGN PATENT DOCUMENTS

WO  2011051763 A1  5/2011

OTHER PUBLICATIONS

Taylor, G.; Galton, I., "A Mostly-Digital Variable-Rate Continuous-Time Delta-Sigma Modulator ADC," Solid-State Circuits, IEEE Journal of , vol. 45, No. 12, pp. 2634,2646, Dec. 2010.
Taylor, G.; Galton, I., "A reconfigurable mostly-digital ΔΣ ADC with a worst-case FOM of 160dB," VLSI Circuits (VLSIC), 2012 Symposium on , vol., No., pp. 166,167, Jun. 13-15, 2012.
Kunnen, George R., U.S. Appl. No. 15/221,286 entitled "System and Method for Linearity Calibration in Mixed-Signal Devices," filed Jul. 27, 2016.

(Continued)

*Primary Examiner* — Joseph Lauture

(57) ABSTRACT

The embodiments described herein provide analog-to-digital converters (ADCs) and systems and methods for calibrating ADCs, including ADCs with poorly characterized nonlinearities that cannot be effectively calibrated with traditional calibration techniques. In general, the embodiments described herein calibrate by measuring output values from an ADC with a known calibration input values being applied. The measured output values are used to determine localized polynomial interpolants. Each of the determined localized polynomial interpolants is then evaluated at an uncorrected output value, and the evaluated localized polynomial interpolants are then used to generate correction values. These correction values can then be used to calibrate the ADC during later operation. Such a calibration technique can provide effective calibration for a variety of ADCs, including ADCs that use inverter-based voltage-to-current (VI) converters and current-controlled ring oscillators.

20 Claims, 11 Drawing Sheets

(56) References Cited

OTHER PUBLICATIONS

Gong Yuehong; Luo Min; Yu Mingyan; Ma Jianguo; Mao Ze, "A novel approach to calibrate open-loop amplifier nonlinearities through piecewise linear interpolation," Solid-State and Integrated Circuit Technology (ICSICT), 2012 IEEE 11th International Conference on , vol., No., pp. 1,3, Oct. 29, 2012-Nov. 1, 2012.

Jie Yuan; Farhat, N.H.; Van der Spiegel, J., "Background Calibration With Piecewise Linearized Error Model for CMOS Pipeline A/D Converter," Circuits and Systems I: Regular Papers, IEEE Transactions on , vol. 55, No. 1, pp. 311,321, Feb. 2008.

Jie Yuan; Sheung Wai Fung; Kai Yin Chan; Ruoyu Xu, "A 12-bit 20 MS/s 56.3 mW Pipelined ADC With Interpolation-Based Nonlinear Calibration," Circuits and Systems I: Regular Papers, IEEE Transactions on , vol. 59, No. 3, pp. 555,565, Mar. 2012.

\* cited by examiner

BASIS FUNCTIONS
$$L_A(Y(i)) = (Y(i) - Y_B)*(Y(i) - Y_C)*(Y(i) - Y_D)/((Y_A - Y_B)*(Y_A - Y_C)*(Y_A - Y_D))$$

LOCALIZED POLYNOMIAL INTERPOLANT
$$Z(i) = L_A(Y(i))*X_A + L_B(Y(i))*X_B + L_C(Y(i))*X_C + L_D(Y(i))*X_D$$
$$\downarrow$$
$$Z(i) = AY(i)^3 + BY(i)^2 + CY(i) + D$$

FIG. 7

| UNCORRECTED OUTPUT VALUE Y(i) | CORRECTED OUTPUT VALUE Z(i) |
|---|---|
| 3.0 | -2.854 |
| 2.5 | -2.468 |
| 2.0 | -1.879 |
| 1.5 | -1.458 |
| 1.0 | -0.961 |
| 0.5 | -0.413 |
| 0.0 | 0.0 |
| -0.5 | 0.487 |
| -1.5 | 0.971 |
| -1.0 | 1.432 |
| -2.0 | 1.995 |
| -2.5 | 2.502 |
| -3.0 | 3.015 |

ANALOG-TO-DIGITAL CONVERSION WITH LINEARITY CALIBRATION

TECHNICAL FIELD

Embodiments relate generally to analog-to-digital conversion, and more particularly, embodiments of the subject matter relate to device calibration in analog-to-digital converters (ADCs). More specifically, the embodiments relate to correction of nonlinearity errors in ADCs.

BACKGROUND

In many modern electronics applications, it is needed in many applications to convert an analog value to a digital value. For example, it some applications it can be needed to convert a continuous physical quantity (such as a voltage) to digital value that represents the amplitude of the physical quantity. Analog-to-digital converters (ADC's) are electronic devices that provide such a conversion.

One continuing issue in ADCs is the need for calibration. In ADCs, calibration can be used to measure and adjust the relationship between the analog input and the digital output. Specifically, such calibration can be used to correct for non-linearity and improve the accuracy of ADCs. For example, such calibration can be used to compensate for non-linearity that arises out of environmental changes (e.g., temperature changes).

Unfortunately, current techniques for calibration in ADCs lack sufficient accuracy for many demanding applications. For example, in ADCs with high levels of non-linearity, the accuracy of calibration using standard techniques can be insufficient. This can be particularly true for ADCs where the nonlinearity is poorly characterized, as current techniques for calibration of poorly characterized nonlinearities are particularly problematic. Thus, what are needed are improved devices and techniques for the calibration of ADCs.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

FIG. 6 shows four exemplary basis functions in accordance with an embodiment;

FIG. 7 shows a localized polynomial interpolant in accordance with an embodiment;

FIG. 9 shows a graphical representation of a correction table in accordance with an embodiment.

DETAILED DESCRIPTION

The embodiments described herein provide a calibration system for analog-to-digital converters (ADCs) that can provide improved performance. Specifically, the embodiments provide systems and methods for calibrating ADCs that can facilitate effective calibration of such ADCs, including ADCs with poorly characterized nonlinearities that cannot be effectively calibrated with traditional calibration techniques.

In general, the embodiments described herein calibrate by measuring output values from an ADC with known calibration input values being applied. The measured output values are used to determine localized polynomial interpolants. Each of the determined localized polynomial interpolants is then evaluated at an uncorrected output value, and the evaluated localized polynomial interpolants are then used to generate correction values. These correction values can then be used to calibrate the ADC during later operation. As will be described in greater detail below, such a calibration technique can provide effective calibration for a variety of mixed signal circuits, including circuits such as analog-to-digital converters (ADC's) and digital-to-analog converters (DACs), as well as the variety of devices that use ADCs and DACs.

In these embodiments, each of these localized polynomial interpolants is a unique function that represents a corrected output of the ADC as a function of the uncorrected output. Such a localized polynomial interpolant can represent a corrected output as a unique function when the uncorrected output values used to generate the interpolant are spaced sufficiently close together. Furthermore, because the localized polynomial interpolants represent the corrected output as a function of the uncorrected output, these interpolants can be used by being evaluated, rather than solved. As will be described below, evaluating such an interpolant can require significantly less computing resources than solving an equivalent interpolant. Thus, the use of such localized polynomial interpolants can significantly reduce resources needed to accurately calibrate an ADC, even where the ADCs include significant nonlinearities.

Figure 1:
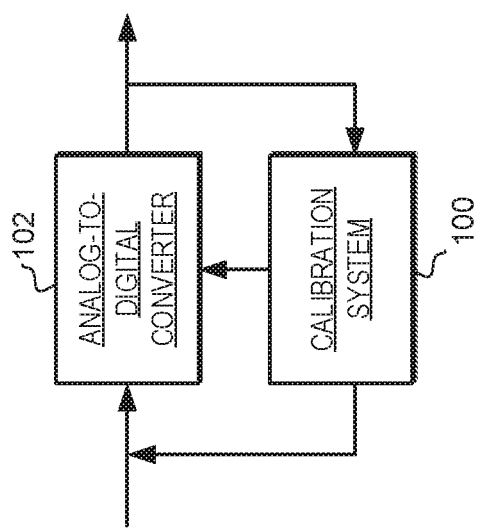
FIG. 1 shows a generalized block diagram of a calibration system for calibrating an analog-to-digital converter (ADC) in accordance with an embodiment.

Turning now to FIG. 1, a schematic diagram of an exemplary calibration system 100 coupled to an ADC 102 is illustrated. The ADC 102 includes an ADC input configured to receive an analog input signal, and an ADC output configured to output a digital output signal that corresponds to the analog input signal. In general, the calibration system 100 is configured to calibrate the ADC 102 to provide for accurate operation of the ADC 102. Such a calibration can compensate for non-linarites that would otherwise affect the accuracy of the ADC 102 output.

To facilitate calibration, the calibration system 100 is configured to apply a set of known input values to an input of the ADC 102 and measure a corresponding set of output values generated by the ADC 102. The calibration system 100 is further configured to group the measured output values into a plurality of localized sets and determine a localized polynomial interpolant for each of these localized sets of output values. With the localized polynomial interpolant determined, the calibration system 100 is further configured to evaluate each localized polynomial interpolant at an uncorrected output value, and to generate a corrected output value from each evaluated localized polynomial interpolants. The calibration system 100 can then utilize the corrected output values to adjust the generated output of the ADC 102 during operation and thus can calibrate the ADC 102.

In one embodiment, the calibration system 100 is configured to determine the localized polynomial interpolants by calculating a basis function for each of the plurality of localized sets. For example, a Lagrange basis function can be calculated for each of the localized sets, and then each Lagrange basis function can be used to determine a corresponding localized polynomial interpolant. A detailed example an embodiment will be described below.

The ADC 102 can be implemented in a variety of ways. As one example, the ADC 102 can include one operational channel and one replica channel. In such an embodiment each channel of the ADC 102 is configured to perform an analog-to-digital conversion, and thus each channel would include an ADC input and an ADC output. Specifically, in such an embodiment the operational channel would be used to provide the operational digital output values, while the replica channel includes an input and output used to calibrate the operational channel.

As another example, the ADC 102 can include a plurality of channels, where again each of the plurality of channels is configured to perform an analog-to-digital conversion. In such an embodiment the ADC 102 can be configured to switch between channels, so that selected channels provide the operational digital output values while other channel(s) are being calibrated with the calibration system 100. Specifically, in such an embodiment the calibration system 100 can be configured to switch between the plurality of channels to facilitate selectively receiving the set of output values from each channel to calibrate one channel in the plurality of channels while other channels in the plurality of channels operate to perform analog-to-digital conversion of the analog input signal.

As will be described in greater detail below, such a calibration system 100 can facilitate effective calibration of an ADC 102 with poorly characterized nonlinearities that cannot be effectively calibrated with some traditional calibration techniques. For example, in some embodiments the ADC 102 can be implemented to use inverter-based voltage-to-current (VI) converters and current-controlled ring oscillators. In such embodiments both the inverter-based VI converters and the current-controlled ring oscillator can introduce significant nonlinearity and that nonlinearity can be poorly characterized such that traditional calibration techniques would likely be ineffective. But as described above, the use the localized polynomial interpolants can facilitate calibration in any ADCs that include significant nonlinearities.

Figure 2:
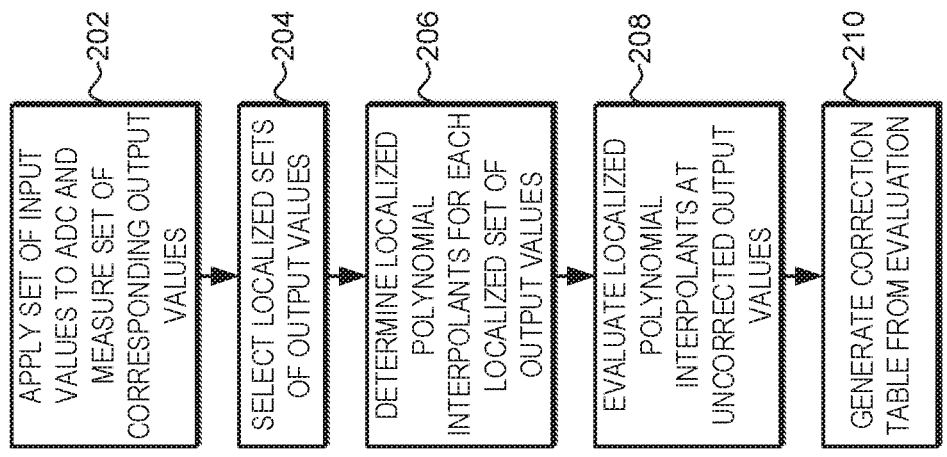
FIG. 2 shows a method of calibration in accordance with an embodiment.

Turning now to FIG. 2, a flow diagram of a method 200 is illustrated. The method 200 is an example of the type of process that can be used by a calibration system (e.g., calibration system 100) to calibrate ADCs (e.g., ADC 102).

The first step 202 of method 200 is to apply a set of input values to the ADC and measure a set of corresponding output values. It should be noted that in this step any suitable number of input values can be used. Additionally, the input values can be selected to have any suitable spacing between input values. In general, applying more input values with closer spacing between input values results in a greater number of output values, and using the greater number of output values can result in greater accuracy of the calibration. However, using a greater number of input and output values also requires greater processing resources to perform the calibration. Thus, it is generally desirable to use sufficient input values to provide the desired accuracy in calibration, without using excessive input and output values that could unacceptably degrade calibration performance.

In a typical embodiment, the set of input values applied to the ADC would have equal or substantially equal spacing between input values. As will be made clear below, providing such equal spacing between input values facilitates the determination of localized polynomial interpolants from the corresponding output values, and further facilitates evaluation of such interpolants for calibration.

As was noted above, in various embodiments the ADC can include a plurality of channels. In such an embodiment the input values for step 202 can be applied to a selected one of a plurality of channels in the ADC. For example, by applying the input values to a replica channel and the measuring the corresponding output values.

Figure 3:
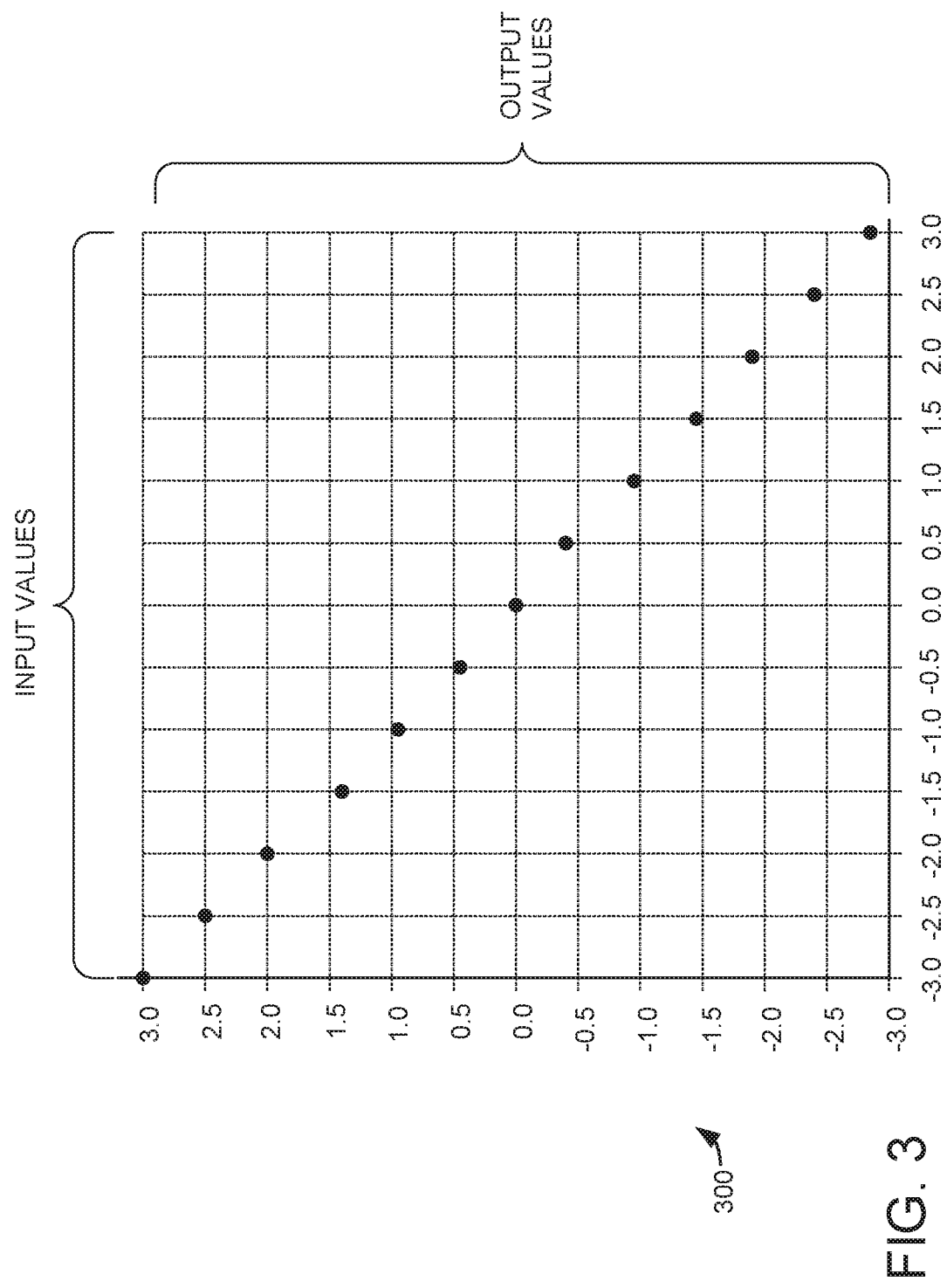
FIG. 3 shows a graphical representation of input values and output values in accordance with an embodiment.

Turning now to FIG. 3, a graphical representation 300 of a set of input values and a corresponding set of generated output values is illustrated. Again, these input values are exemplary of the type of input values that can be inputted to an ADC during calibration, and are further exemplary of the corresponding output values that can be generated by the ADC in response to these input values. For example, the illustrated set of input values are exemplary of the type of input values that can be applied to the analog input of an ADC, while the illustrated set of output values are exemplary of the digital output values that can be generated by the ADC in response to the these input values.

In the example of FIG. 3, thirteen input values are applied to the input of the ADC, and a corresponding thirteen output values are generated. However, this is just one example, and in other embodiments more or less input and output values can be used. Again, providing more input values and measuring more corresponding output values across the operation range of the ADC generally increases the accuracy of the calibration, at the expense of also increasing the resources needed to perform the calibration. It should be further noted that input values illustrated in this example have equal spacing between values (i.e., are equidistant) but due to the non-linearity of the ADCs, the corresponding output values have non-equal spacing.

Finally, it should be noted that in this example the input values and output values express an inverse, a monotonically decreasing relationship. For example, an input value of +3.0 results in a corresponding output value of approximately −2.8. Again, this is just one example, and in other examples, for instance, a direct, monotonically increasing relationship can exist between the input values and the output values.

Returning to FIG. 2, the next step 204 in method 200 is to select localized sets of the output values. In general, each localized set of output values includes two or more adjacent output values that will be used together to generate a localized polynomial interpolant. In a typical embodiment each localized set of output values can include three or four adjacent output values, and with those three or four output values used together to generate a corresponding localized polynomial interpolant. Furthermore, to improve accuracy of the calibration it is generally desirable to select the localized sets of output values such that each partially overlaps with adjacent sets. This overlapping results in a greater number of localized sets, which can improve the accuracy of the calibration.

Figure 4:
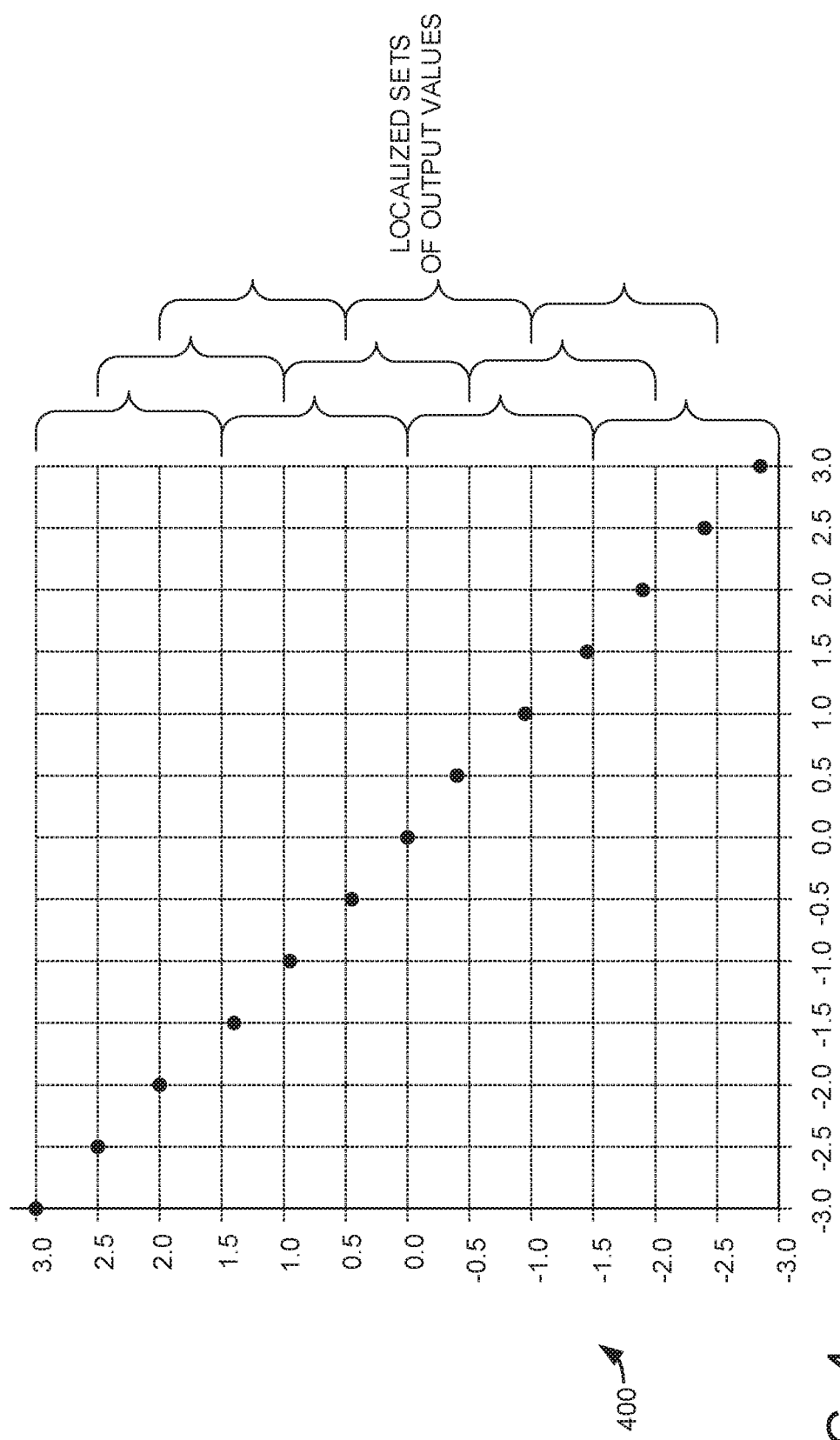
FIG. 4 shows a graphical representation of input values and output values, with the output values in defined localized sets in accordance with an embodiment.

Turning now to FIG. 4, a graphical representation 400 of the set of input values and corresponding set of generated output values is again illustrated. Furthermore, in FIG. 4 the output values are shown as being each assigned to one or more of a plurality of localized sets of output values, as indicated on the side of FIG. 4. Specifically, in the example of FIG. 4 thirteen output values are assigned to ten localized sets of output values, where each of the localized sets of output values includes four adjacent output values. Furthermore, in this example, each of the localized sets of output values partially overlaps with nearby localized sets of output values. Stated another way, the localized sets of output values intersect with at least one adjacent localized set of output values.

Again, it should be noted this is just one example of how such localized sets of output values can be configured. For example, in other embodiments such localized sets can include more or less output values in each set. Furthermore, in other embodiments the localized sets could be non-overlapping sets such that each output value is only a member of one localized set.

Returning to FIG. 2, the next step 206 in method 200 is to determine a localized polynomial interpolant for each of the localized sets of output values. In general, each of these localized polynomial interpolants is a unique function that represents a corrected output of the ADC as function of the uncorrected output of the ADC. As one example, each of these localized polynomial interpolants is an $N^{th}$ degree polynomial, where N+1 is the number of output values in the corresponding localized set of output values. As will be described below, because the localized polynomial interpolants represent the corrected output as function of the uncorrected output, they can be used to compensate for the non-linearity of the ADC. Furthermore, because the localized polynomial interpolants represent the corrected output as a function of the uncorrected output, these interpolants can be used by being evaluated, rather than solved. Evaluating such an interpolant requires significantly less computing resources than would be required to solve an interpolant where instead the uncorrected output is a function of the corrected output. Thus, the use of such localized polynomial interpolants can significantly reduce resources needed to accurately calibrate a variety of ADCs.

In general, the localized polynomial interpolants are generated using the output values in the corresponding localized set of output values. For example, an $N^{th}$ order polynomial can be fitted to N+1 output values in the localized set. Thus, in an embodiment where each localized set of output values includes four output values, the localized polynomial interpolant can comprise a cubic function (N=3) that is fitted to those four output values. Likewise, in an embodiment where each localized set of output values includes three output values, the localized polynomial interpolant can comprise a quadratic function (N=2) that is fitted to those three output values. Of course, these are just two examples, and higher order equations can be used with localized sets that include greater numbers of output values.

In one embodiment, the localized polynomial interpolants are each determined using a corresponding set of basis functions. In one more specific embodiment, each basis function can be directly calculated from a set of distinct points. In general, a basis function is an elementary continuous function which can be combined with other basis functions to form another continuous function. In this embodiment, basis functions are linearly combined to form the localized polynomial interpolants, where the localized polynomial interpolants are continuous functions that provide an interpolating function.

In one more specific embodiment, the localized polynomial interpolants are Lagrange polynomials, where a Lagrange polynomial is defined as the unique polynomial of the least degree that intersects a set of distinct points. In these embodiments the localized polynomial interpolants are each determined by linearly combining a set of Lagrange basis functions. Specifically, Lagrange basis functions can be directly calculated from a distinct set of output values and then linearly combined to generate a Lagrange polynomial which functions as a localized polynomial interpolant.

Figure 5:
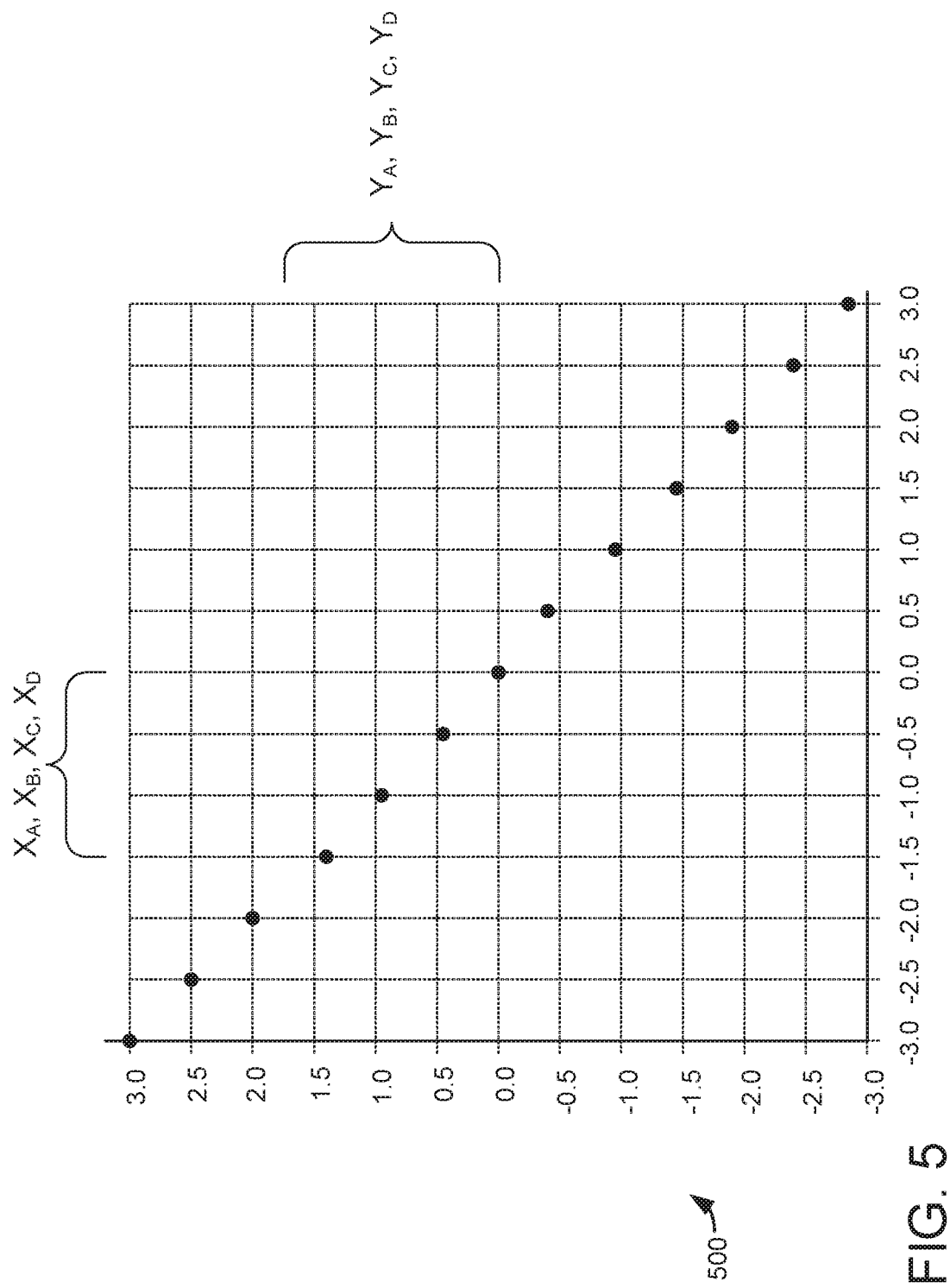
FIG. 5 shows a graphical representation of one localized set of output values and corresponding input values in accordance with an embodiment.

Turning now to FIG. 5, a graphical representation 500 of one localized set of input values ($X_A$, $X_B$, $X_C$, and $X_D$) and a corresponding localized set of output values ($Y_A$, $Y_B$, $Y_C$, and $Y_D$) is illustrated. Again, in this embodiment the localized set of output values comprises four adjacent output values, but in other implementations more or less output values could be included in each localized set. It should be noted that the localized set of input values ($X_A$, $X_B$, $X_C$, and $X_D$) and the corresponding localized set of output values ($Y_A$, $Y_B$, $Y_C$, and $Y_D$) are representative of any set of input values and corresponding output values, and as such will be used herein to define an example localized polynomial interpolant that is generated from the localized set of output values.

Turning now to FIG. 6, four exemplary basis functions 600 are illustrated. These basis functions are exemplary of the type of basis function that can be used to define localized polynomial interpolants. The four basis functions (indicated as $L_A(Y(i))$, $L_B(Y(i))$, $L_C(Y(i))$, and $L_D(Y(i))$) are defined as in terms of four localized output values $Y_A$, $Y_B$, $Y_C$, and $Y_D$ and as a function of an uncorrected output value of interest $Y(i)$. The four basis functions 600 are an example of Lagrange basis functions that are particularly applicable to the embodiments described herein. Specifically, these Lagrange basis functions can be combined to generate a localized Lagrange polynomial that will provide a localized polynomial interpolant. When the output values $Y_A$, $Y_B$, $Y_C$, and $Y_D$ used to define the four basis functions are sufficiently closely spaced along the nonlinearity in question, such a Lagrange polynomial interpolant will closely match the nonlinearity over the range corresponding to those output values. Thus, the Lagrange polynomial interpolant represents the corrected output of the ADC as function of the uncorrected output.

Turning now to FIG. 7, an exemplary localized polynomial interpolant 700 is illustrated. First, the localized polynomial interpolant 700 is defined in terms of the four basis functions $L_A$, $L_B$, $L_C$, and $L_D$ and four input values $X_A$, $X_B$, $X_C$, and $X_D$. Second, the localized polynomial interpolant 700 is illustrated as an equivalent cubic polynomial function in terms of the uncorrected output value $Y(i)$. Again, in this illustrated example, the basis functions can be Lagrange basis functions and thus the localized polynomial interpolant 700 can be a Lagrange polynomial.

The exemplary localized polynomial interpolant 700 defines a corrected output value $Z(i)$ in terms of the uncorrected output value $Y(i)$. This interpolant 700 can be used to generate corrected output values for calibration by being evaluated, rather than solved. Specifically, the interpolant 700 can be evaluated by simply inserting the uncorrected output value $Y(i)$ into the interpolant 700 and calculating the result $Z(i)$. Thus, evaluating the localized polynomial interpolant rather than solving can be efficiently executed in hardware and will typically require significantly less computing resources, and thus can provide for faster and more efficient calibration. Again, the accuracy of this technique is dependent on the condition that the set of output values used to generate the basis functions lie sufficiently closely to one another, such that the localized polynomial interpolant 700 can sufficiently match the nonlinearity over the range of output values spanned by the set of output values.

Returning to FIG. 2, it should be noted that the step 206 in method 200 would be performed for each of the localized sets of output values. Thus, for the example of FIG. 4, the ten overlapping localized sets of output values would be used to determine ten localized polynomial interpolants 700. And as such, each of these localized polynomial interpolants applies to a piecewise portion of the range of output values. And again, it should be noted that because localized sets of output values overlap, the localized polynomial interpolants functionally overlap as well.

The next step 208 in method 200 is to evaluate the localized polynomial interpolants at uncorrected output values. Specifically, with the localized polynomial interpolants generated for each localized set of output values, these interpolants can then be used to generate a corresponding set of corrected output values. It should be noted that in performing step 208 for an uncorrected output value, that the localized polynomial interpolant most closely centered on the uncorrected output should be used. As was noted above, in some embodiments the localized sets of output values partially overlap, and in those cases the localized polynomial interpolants also would partially overlap. Thus, in these cases it is generally desirable to use the localized polynomial interpolant that is most closely centered on the uncorrected output value.

And again these localized polynomial interpolants can evaluated, rather than solved. Thus, step 208 can be performed by simply inserting uncorrected output values Y(i) into the localized polynomial interpolant and evaluating the interpolant to calculate the corrected output value Z(i).

Figure 8:
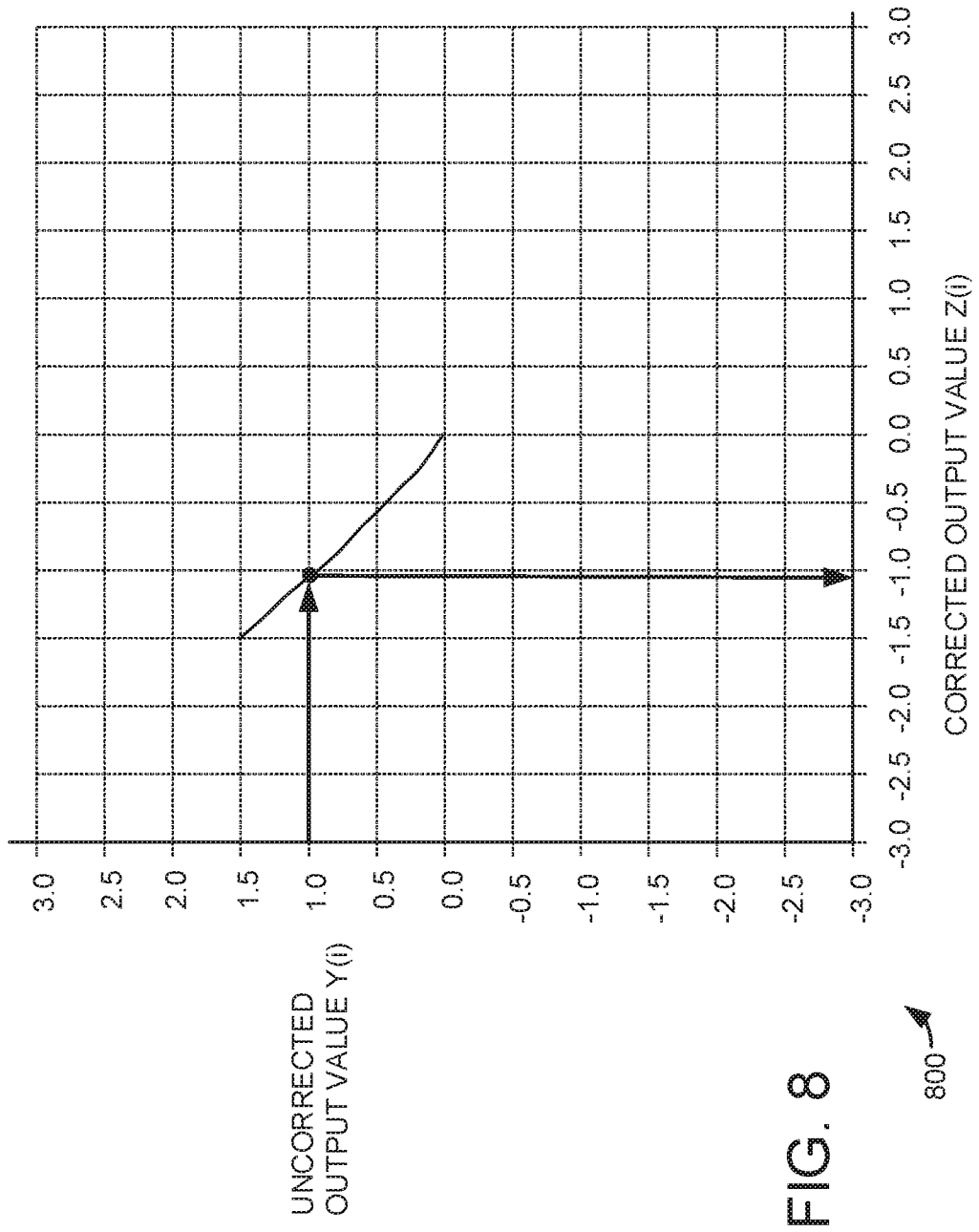
FIG. 8 shows a graphical representation of an uncorrected output value and a corresponding corrected output value in accordance with an embodiment.

Turning now to FIG. 8, a graphical representation 800 of an uncorrected output value Y(i) and corresponding corrected output value Z(i) is illustrated. Specifically, the graphical representation 800 shows an example result of a localized polynomial interpolant being evaluated with an uncorrected output value Y(i) as the input variable to generate a corrected output value Z(i).

The next step 210 in method 200 is to generate a correction table for the evaluation. In general, this step performs the evaluation of step 208 for a selected group of uncorrected output values and generates a corresponding set of corrected output values. These uncorrected output values and corrected output values can be used to populate a correction table, and that correction table can then be used for future operation of the ADC. Turning to FIG. 9, a graphical representation of exemplary correction table 900 is illustrated. The correction table 900 includes a set of uncorrected output values Y(i) and a corresponding set of corrected output values Z(i).

Again, such a correction table 900 can be used during operation of the ADC to provide calibration of the ADC. Specifically, the corrected output values can be substituted for the output of the ADC to provide calibration correction.

Thus, once the correction table 900 has been generated, those corrected solutions can be used for later uncorrected output values being outputted by the ADC. As one detailed example, the correction table 900 can be implemented as a look up table (LUT), where the uncorrected output values serve as addresses to select more accurate corrected output values which are then substituted for the uncorrected output values. For example, the uncorrected output values can be implemented as a 5-bit LUT addresses that selects one of 32 registers, where each register contains a more accurate corrected output value that will serve as the actual ADC output.

As was noted above, in some embodiments the ADC can include multiple channels. For example, in some embodiments the ADC can include one operational channel and one replica channel. In such an embodiment steps 202-210 would typically be performed for the replica channel, and the resulting correction table 900 can then be used to calibrate the operational channel.

In another embodiment, the ADC can include a plurality of channels. In such an embodiment steps 202-210 could be selectively performed in turn for each channel. For example, steps 202-210 could be performed for one selected channel while the other channels are operational. With steps 202-210 performed, a correction table 900 is generated for that particular channel. That specific channel can then become operational and a next channel selected for calibration. This process can continue such that a separate correction table 900 is generated for each of the channels in the ADC.

Furthermore, it should be noted that in a typical application steps 202-210 could be performed for each channel relatively infrequently. Thus, once the correction table is generated it can be used for some significant length of time to provide calibration to the ADC. However, because the method 200 evaluates localized polynomial interpolants rather than solving them, the processing required to perform steps 202-210 can be significantly reduced. Thus, in some embodiments these calibration steps can be performed more frequently than traditional techniques. Likewise, in some embodiments these calibration steps can be performed with less computing resources than were required with some traditional techniques.

Figure 10:
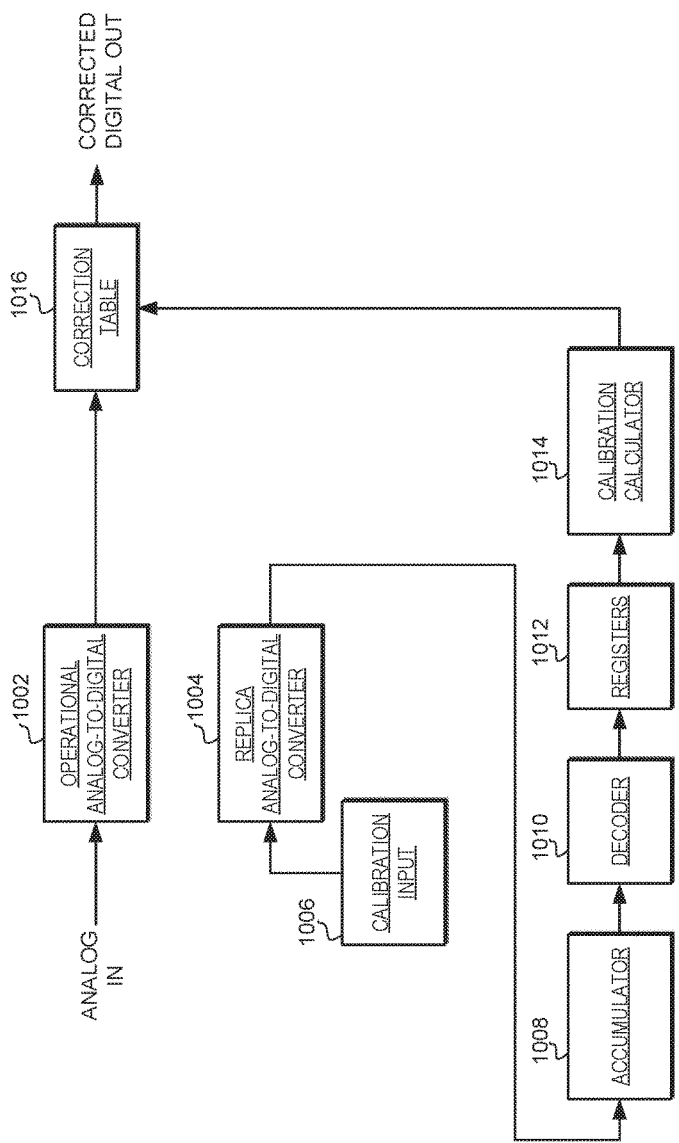
FIG. 10 shows a schematic diagram of an exemplary analog-to-digital converter in accordance with an embodiment.

Turning now to FIG. 10, a detailed example of an ADC 1000 is illustrated schematically. ADC 1000 is an example of the type of analog-to-digital converter that can be implemented to use the calibration techniques described above with reference to FIGS. 2-9. The ADC 1000 includes an operational ADC 1002, a replica ADC 1004, a calibration input 1006, an accumulator 1008, a decoder 1010, registers 1012, calibration calculator 1014 and correction table 1016. It should be noted that in this example both the operational ADC 1002 and the replica ADC 1004 can include multiple channels, and each of these channels can generate multiple bits of digital data.

In general, the ADC 1000 uses the replica ADC 1004 to generate correction values that are stored in the correction table 1016, and those correction values are then used to calibrate the output of the operational ADC 1002. To facilitate this, the replica ADC 1004 is configured to closely match the operational ADC 1002. Specifically, the replica ADC 1004 is configured to have nonlinearities and other performance characteristics that closely approximate the nonlinearities and performance characteristics of the operational ADC 1002. When so configured, the replica ADC can be used generate correction values that can also calibrate the output of the operational ADC 1002.

Specifically, a set of input values can be inputted to the replica ADC 1004, and corresponding uncorrected output values measured from the output of the replica ADC 1004. The set of input values and corresponding uncorrected output values can then be used to generate corrected values using the techniques described above with reference to FIGS. 2-9. Those corrected values can then be used to populate the correction table 1016, and because the replica ADC 1004 closely matches the operational ADC 1002, those corrected values generated using the input and output values of the replica ADC 1004 will also work to calibrate the operational ADC 1002.

In the ADC 1000, the calibration input 1006, accumulator 1008, decoder 1010, registers 1012, calibration calculator 1014 and correction table 1016 are implemented to perform the calibration. Specifically, the calibration input 1006 is configured to generate the sets of input values that are inputted to the replica ADC 1004. The calibration input 1006 can be configured to generate those sets of input values with any suitable configuration. However, as was noted above, having a greater number of input values and closer spacing between input values will result in a greater number of corresponding output values and can also result in greater accuracy of the calibration. And in most embodiments the sets of input values would be generated to have substantially equal spacing between input values, as such equal spacing facilitates the determination of localized polynomial interpolants from the corresponding output values.

The accumulator 1008 is coupled to the replica ADC 1004 output and is configured to receive the sets of generated uncorrected output values. In general, the accumulator 1008 is configured to receive multiple sets of uncorrected output values and to average the corresponding values in those multiple sets of output values. Receiving multiple sets of output values and averaging the corresponding values in those sets results in output values that are more likely to accurately represent the nonlinearities of the replica ADC 1004 and thus will result in more accurate calibration.

Each output value in the sets of averaged output values can then selected by the decoder 1010 and stored in a corresponding register in registers 1012. It should be noted that in a typical embodiment the decoder 1010 is an L-output decoder, where L is the number of output values in each set. Likewise, there are L registers in 1012, configured to store the L output values.

With uncorrected output values stored in the registers 1012, the calibration calculator 1014 can generate corrected output values using the techniques described above. Specifically, the uncorrected output values stored in registers 1012 are used by the calibration calculator 1014 to determine localized polynomial interpolants. Each of the determined localized polynomial interpolants is then evaluated at an uncorrected output value, and the evaluated localized polynomial interpolants are then used by the calibration calculator 1014 to generate corrected output values. Because the localized polynomial interpolants represent the corrected output as a function of the uncorrected output, the calibration calculator 1014 can evaluate the interpolants to determine the corrected output values. Again, evaluating such an interpolant can require significantly less computing resources than solving an equivalent interpolant.

With the corrected output values generated, the calibration calculator 1014 can generate the correction table 1016, where the correction table facilitates correction of the output of the operational ADC 1002. As one example, the correction table 1016 can be implemented as a look up table (LUT), where the uncorrected output values serve as addresses to select a more accurate corrected output values which are then substituted for the uncorrected output values. For example, the uncorrected output values can be implemented as a 5-bit LUT addresses that selects one of 32 registers, where each register contains a more accurate corrected output value that will serve as the actual output of the ADC 1000.

To perform these operations the calibration calculator 1014 and other elements can be implemented with any suitable combination of processing devices, including processors, processing units, or microprocessors. Furthermore, such processing devices can be implemented as an integrated circuit with the operational ADC 1002, or separate from the operational ADC 1002.

As some specific examples, the calibration calculator 1014 can be implemented with specialized processing hardware designed to implement the steps described above. For example, as hardware specially designed to perform low-rate interpolation arithmetic. In other examples, the calibration calculator 1014 can be implemented as software implemented programs, and then executed with a processing device that utilizes integrated circuits designed to execute programs stored in a memory. Some processing devices include application-specific integrated circuits (ASICs) designed for particular use cases, or general purpose central processing units (CPUs) that commonly provide the central processing functionality of typical computers. System on Chip (SoC) processors can integrate a wide variety of components of a system into a single chip. Such devices may include digital, analog, mixed-signal and other functions on a single chip substrate. As such, SoC processors can be used to implement with the calibration techniques on a single chip with one or more ADCs.

It should be noted conventional techniques related to processor design may not be described in detail herein. It should be understood that devices described herein may be implemented either in silicon or another semiconductor material or alternatively by software code representation thereof.

Figure 11:
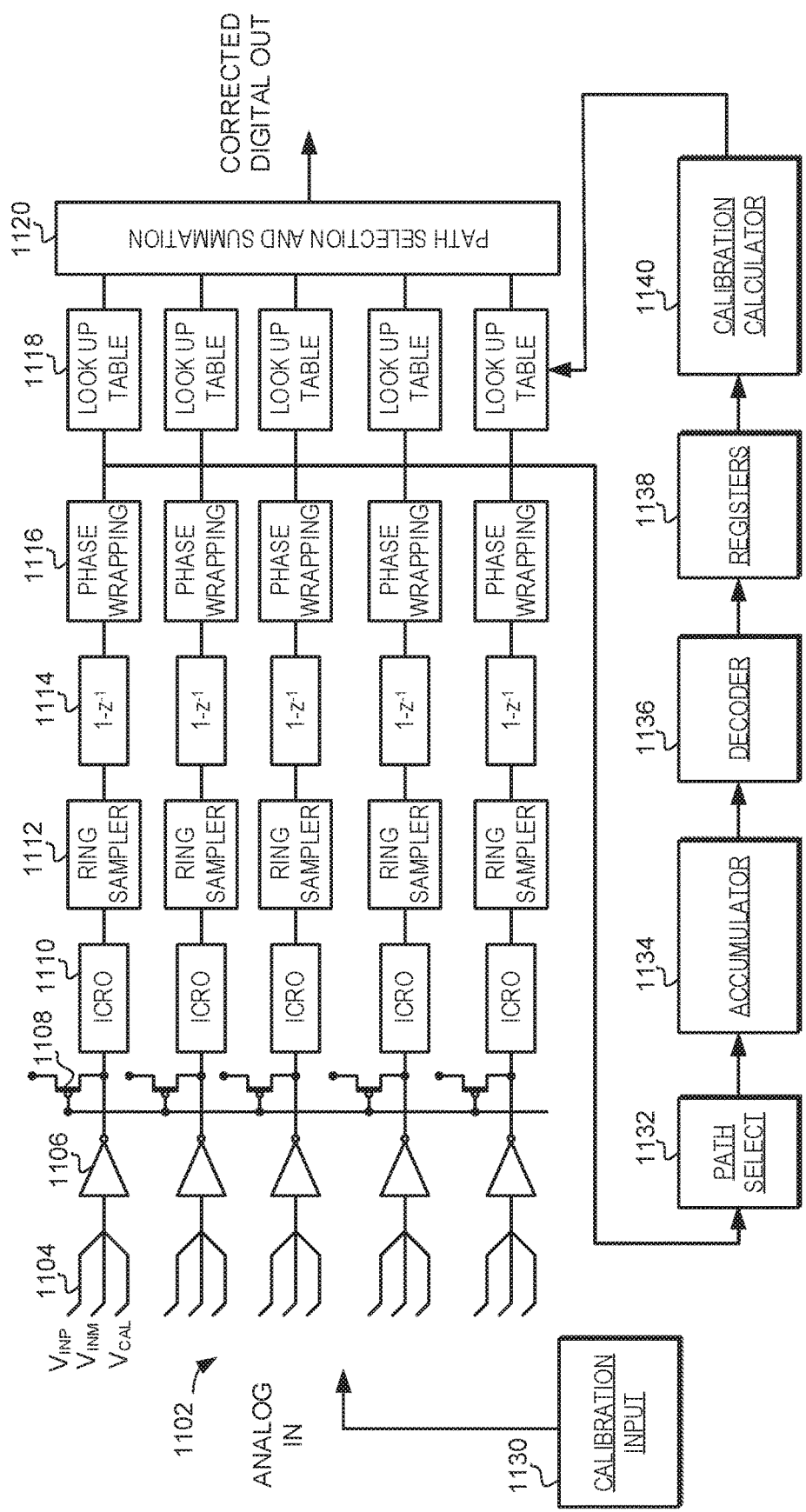
FIG. 11 shows a schematic diagram of an exemplary analog-to-digital convert in accordance with an embodiment.

Turning now to FIG. 11, another detailed example of an ADC 1100 is illustrated schematically. In general, the ADC 1100 is ring oscillator based sigma-delta analog-to-digital converter. Furthermore, the ADC 1100 uses inverter-based VI converters and current-controlled ring oscillators. As will be described in greater detail below, the use of such inverter-based VI converters and current-controlled ring oscillators can provide significant performance improvement. However, these inverter-based VI converters and current-controlled ring oscillators can also introduce significant, poorly characterized nonlinearities. Traditional calibration techniques can be ineffective to calibrate devices with such poorly characterized nonlinearities. Thus, the ADC 1100 is example of the type of analog-to-digital converter that can be implemented to use the calibration techniques described above.

The ADC 1100 includes five channels 1102, with each channel 1102 configured to perform an analog-to-digital conversion. Each channel 1102 includes an input selector 1104, an inverter-based VI converter 1106, a centering transistor 1108, a current-controlled ring oscillator (ICRO) 1110, a ring sampler 1112, a digital differentiator 1114, a phase wrapping logic block 1116, and a look up table 1118. Each of the five channels is outputted to a path section and summation device 1120. It should be noted that in this example each of the channels 1102 would output multiple bits of digital data. As will be described in greater detail below, providing these five channels 1102 allows one channel 1102 to be calibrated while the other four channels 1102 are being operated for the analog-to-digital conversion of an analog input voltage.

As noted above, the ADC 1100 is a ring oscillator based sigma-delta analog to digital converter. During operation, the analog signals are applied to the input selectors 1104, which function as an input switching network to determine which signals are applied to which inverter-based VI converter 1106 of which channels 1102. The inverter-based VI converter 1106 in each channel 1102 functions as an analog voltage-to-current converter. Thus, analog input voltages are converted to input currents and applied to the input of a corresponding ICRO 1110. In this configuration the ICROs 1110 function as current-starved ring oscillators, with the center frequency of each ICRO 1110 determined by the corresponding centering transistor 1108. The ICROs 1110, ring samplers 1112, digital differentiators 1114, and phase wrapping logic 1116 together perform a sigma-delta analog-to-digital conversion, with the outputs of each analog-to-digital conversion passed to a corresponding lookup table 1118.

To calibrate these five channels 1102, the ADC 1100 also includes a calibration input 1130, a path select device 1132, an accumulator 1134, a decoder 1136, registers 1138 and a calibration calculator 1140. The calibration input 1130 is configured to generate the sets of input values that are selectively inputted to the five channels 1102 for calibration. Again, the calibration input 1130 can be configured to generate those sets of input values with any suitable configuration. The path select device 1132 is configured to select sets of uncorrected output values (from phase wrapping logic 1116) of the channel 1102 being calibrated and pass those values accumulator 1134. The accumulator 1134 is configured to receive multiple sets of uncorrected output values and average the corresponding values. Each output value in the sets of averaged output values can then be selected by the decoder 1136 and stored in a corresponding register in registers 1138. Again, it should be noted that in a typical embodiment the decoder 1136 is an L-output decoder, where L is the number of output values in each set. Likewise, there are L registers in 1138, configured to store the L output values.

With uncorrected output values stored in the registers 1138, the calibration calculator 1140 can generate corrected output values using the techniques described above. Specifically, the uncorrected output values stored in registers 1138 are used by the calibration calculator 1140 to determine localized polynomial interpolants. Each of the determined localized polynomial interpolants is then evaluated at an uncorrected output value, and the evaluated localized polynomial interpolants are then used by the calibration calculator 1140 to generate corrected output values. With the corrected output values generated, the calibration calculator 1140 can update the corresponding look up table 1118, where the look up table facilitates correction of the corresponding channel 1102 output.

It should be noted during operation, one of the five channels 1102 can be calibrated, while the other four channels 1102 are used for analog-to-digital conversion of received input signals. When that one channel is calibrated (e.g., updated values are loaded into the corresponding look up table 1118) the configuration of the input selectors 1104 and the path selection and summation device 1120 can be changed such that another channel is calibrated and the previously calibrated channel is used for analog-to-digital conversion of received input values. This process can be continued, such that each of the five channels 1102 is regularly calibrated.

It should be noted that this configuration facilitates regular calibration for each channel 1102 of the ADC 1100 without requiring that the channels have matching nonlinearities or otherwise function as a replica channel.

Figure 12:
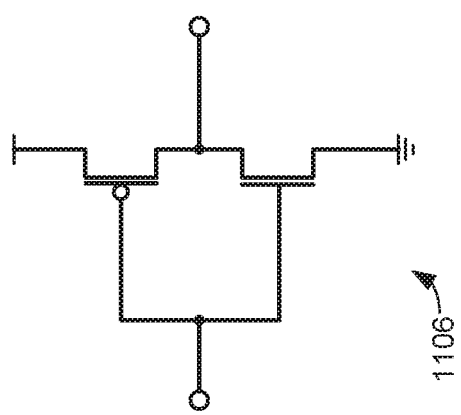
FIG. 12 shows a circuit diagram of an exemplary inverter-based voltage-to-current (VI) converter in accordance with an embodiment.

As was noted above, the use of localized polynomial interpolants and the calibration techniques described with reference to FIGS. 2-9 facilitates the use of inverter-based VI converters 1106 and ICROs 1110 in the ADC 1100. These VI converters 1106 can be implemented as relatively simple, single-stage two-transistor inverters. Turning briefly to FIG. 12, a circuit diagram of an exemplary single-stage, two-transistor voltage-to-current converter 1106 is illustrated. Such inverter-based VI converters 1106 naturally provide high impedance at their inputs. Thus, such inverter-based VI converters 1106 can eliminate the need for operational amplifiers to provide a linear buffered current to a low impedance node. This also further facilitates the use of resistor based calibration DACs.

Furthermore, such inverter-based VI converters 1106 can be implemented with thin-oxide core MOS transistors, and when so implemented such inverter-based VI converters 1106 are much more compact than operational amplifiers configured as buffers. Furthermore, such inverter-based VI converters 1106 do not require high voltage supplies. Finally, such inverter-based VI converters 1106 can be allowed to have rail to rail input swing. Specifically, the two transistors in the single-stage inverter-based VI converter 1106 do not need to be kept in saturation during operation of the ADC, and this can greatly simplify their implementation.

However, these inverter-based VI converters 1106 and current-controlled ring oscillators 1110 can also introduce significant, poorly characterized nonlinearities. Traditional calibration techniques can be ineffective to calibrate devices with such poorly characterized nonlinearities. Thus, the ADC 1100 is an example of the type of analog-to-digital converter that can be implemented to use the calibration techniques described above.

In one embodiment, an analog-to-digital converter (ADC) is provided, comprising: an ADC input configured to receive an analog input signal; an ADC output configured to output a digital output signal corresponding to the analog input signal; a calibration system, the calibration system coupled to the ADC input and the ADC output, the calibration system configured to: receive a set of output values; select a plurality of localized sets of the output values; determine a localized polynomial interpolant for each of the plurality of localized sets of output values; evaluate each of the localized polynomial interpolants at a corresponding uncorrected output point; and generate a plurality of corrected output values from each of the evaluated localized polynomial interpolants.

In another embodiment, an analog-to-digital converter (ADC) is provided, comprising: a plurality of channels, each of the plurality of channels including an input and a output, the input configured to receive an analog input signal, and the output configured to output a digital output signal corresponding to the analog input signal, and wherein each of the plurality of channels includes an inverter-based voltage-to-current (VI) converter and a current-controlled ring oscillator, each inverter-based voltage-to-current (VI) converter coupled between a corresponding channel input and a corresponding current-controlled ring oscillator, each inverter-based voltage-to-current (VI) converter configured to provide a voltage-to-current conversion of a corresponding analog input signal; a calibration system, the calibration system coupled to the plurality of channels, the calibration system configured to: generate a set of input values and apply the set of the input values to the input of a selected channel of the plurality of channels; receive a set of output values from the selected channel of the plurality of channels; select a plurality of localized sets of the output values, wherein each of the plurality of localized sets of output values overlaps with at least one adjacent localized set of output values; determine a localized polynomial interpolant for each of the plurality of localized sets of output values; evaluate each of the localized polynomial interpolants at a corresponding uncorrected output point; generate a plurality of corrected output values from each evaluated localized polynomial interpolants; and apply the plurality of corrected output values to calibrate the selected channel of the plurality of channels.

In another embodiment, a method of calibrating an analog-to-digital converter (ADC), the method comprising: applying a set of input values to the ADC and measuring a corresponding set of output values from the ADC; selecting a plurality of localized sets of the output values; determining a localized polynomial interpolant for each of the plurality of localized sets of output values; evaluating each of the localized polynomial interpolants at a corresponding uncorrected output value; and generating a plurality of corrected output values from each evaluated localized polynomial interpolants.

For the sake of brevity, conventional techniques related to signal processing, sampling, analog-to-digital conversion, digital-to-analog conversion, analog circuit design, differential circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode). The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter. In addition, certain terminology may also be used in the foregoing description for the purpose of reference only, and thus are not intended to be limiting.

The terms "first," "second," "third," "fourth" and the like in the description and the claims are used for distinguishing between elements and not necessarily for describing a particular structural, sequential or chronological order. It is to be understood that the terms so used are interchangeable under appropriate circumstances. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. An analog-to-digital converter (ADC), comprising:
   an ADC input configured to receive an analog input signal;
   an ADC output configured to output a digital output signal corresponding to the analog input signal;
   a calibration system, the calibration system coupled to the ADC input and the ADC output, the calibration system configured to:
   receive a set of output values;
   select a plurality of localized sets of the output values;
   determine a localized polynomial interpolant for each of the plurality of localized sets of output values;
   evaluate each of the localized polynomial interpolants at a corresponding uncorrected output point; and
   generate a plurality of corrected output values from each of the evaluated localized polynomial interpolants.

2. The ADC of claim 1, wherein the calibration system is configured to generate a set of input values and apply the set of the input values to the ADC input, and wherein the calibration system is further configured to receive the set of output values from the ADC output.

3. The ADC of claim 1, wherein the calibration system further comprises a replica ADC, and wherein the calibration system is configured to generate a set of input values and apply the set of the input values to the replica ADC, and wherein the calibration system is further configured to receive the set of output values from the replica ADC.

4. The ADC of claim 1, wherein the ADC comprises a plurality of channels, each of the plurality of channels configured to perform an analog-to-digital conversion, and wherein the calibration system is configured to switch between the plurality of channels to facilitate selectively receiving the set of output values from each channel to calibrate each channel.

5. The ADC of claim 4, wherein the calibration system is configured to calibrate one channel in the plurality of channels while other channels in the plurality of channels operate to perform analog-to-digital conversion of the analog input signal.

6. The ADC of claim 1, wherein the ADC includes an inverter-based voltage-to-current (VI) converter, the inverter-based voltage-to-current (VI) coupled to the analog input and configured to provide a voltage-to-current conversion of the analog input signal.

7. The ADC of claim 6, wherein the ADC wherein the inverter-based voltage-to-current (VI) converter includes an output, and wherein the inverter-based voltage-to-current (VI) converter output is coupled to an input of a current-controlled ring oscillator.

8. The ADC of claim 7, wherein the calibration system is configured to compensate for nonlinearity in both the inverter-based voltage-to-current (VI) converter and the current-controlled ring oscillator.

9. The ADC of claim 6, wherein the ADC wherein the inverter-based voltage-to-current (VI) converter is implemented with only a single-stage inverter.

10. The ADC of claim 9, wherein the single-stage inverter is not constrained to operate only in saturation during operation of the ADC.

11. The ADC of claim 1 wherein the calibration system is configured to determine a localized polynomial interpolant for each of the plurality of localized sets of output values by calculating a basis function for each of the plurality of localized sets of output values.

12. The ADC of claim 11 wherein the basis function for each of the plurality of localized sets of output values comprises a Lagrange basis function.

13. The ADC of claim 1 wherein each of the localized polynomial interpolants comprises an Nth order polynomial function, where N is greater than or equal to 3.

14. The ADC of claim 1 wherein each of the plurality of localized sets of output values overlaps with at least one adjacent localized set of output values.

15. The ADC of claim 1 wherein the calibration calculator is further configured to populate a correction table with the plurality of corrected output values and a plurality of uncorrected output values.

16. An analog-to-digital converter (ADC), comprising:
a plurality of channels, each of the plurality of channels including an input and a output, the input configured to receive an analog input signal, and the output configured to output a digital output signal corresponding to the analog input signal, and wherein each of the plurality of channels includes an inverter-based voltage-to-current (VI) converter and a current-controlled ring oscillator, each inverter-based voltage-to-current (VI) converter coupled between a corresponding channel input and a corresponding current-controlled ring oscillator, each inverter-based voltage-to-current (VI) converter configured to provide a voltage-to-current conversion of a corresponding analog input signal;
a calibration system, the calibration system coupled to the plurality of channels, the calibration system configured to:
generate a set of input values and apply the set of the input values to the input of a selected channel of the plurality of channels;
receive a set of output values from the selected channel of the plurality of channels;
select a plurality of localized sets of the output values, wherein each of the plurality of localized sets of output values overlaps with at least one adjacent localized set of output values;
determine a localized polynomial interpolant for each of the plurality of localized sets of output values;
evaluate each of the localized polynomial interpolants at a corresponding uncorrected output point;
generate a plurality of corrected output values from each evaluated localized polynomial interpolants; and
apply the plurality of corrected output values to calibrate the selected channel of the plurality of channels.

17. The ADC of claim 16 wherein the calibration system is configured to determine a localized polynomial interpolant for each of the plurality of localized sets of output values by calculating a Lagrange basis function for each of the plurality of localized sets of output values.

18. A method of calibrating an analog-to-digital converter (ADC), the method comprising:
applying a set of input values to the ADC and measuring a corresponding set of output values from the ADC;
selecting a plurality of localized sets of the output values;
determining a localized polynomial interpolant for each of the plurality of localized sets of output values;
evaluating each of the localized polynomial interpolants at a corresponding uncorrected output value; and
generating a plurality of corrected output values from each evaluated localized polynomial interpolants.

19. The method of claim 18 wherein the step of determining a localized polynomial interpolant for each of the plurality of localized sets of output values comprises generating a set of basis functions for each of the plurality of localized sets of output values, and wherein the set of basis functions for each of the plurality of localized sets of output values comprises a set of Lagrange basis functions.

20. The method of claim 18 wherein the ADC includes an inverter-based voltage-to-current (VI) converter and a current-controlled ring oscillator.

\* \* \* \* \*